United States Patent
Leete (10) Patent No.: US 7,432,763 B2
(45) Date of Patent: Oct. 7, 2008

(54) GAIN BOOSTING FOR TUNED DIFFERENTIAL LC CIRCUITS

(75) Inventor: John Leete, Huntington Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/690,932

(22) Filed: Mar. 26, 2007

(65) Prior Publication Data

US 2007/0200628 A1    Aug. 30, 2007

Related U.S. Application Data

(63) Continuation of application No. 11/029,603, filed on Jan. 5, 2005, now Pat. No. 7,202,740.

(51) Int. Cl.
*H03F 3/45* (2006.01)

(52) U.S. Cl. .................. 330/254; 330/278; 330/305

(58) Field of Classification Search ............... 330/253, 330/254, 278, 305
See application file for complete search history.

(56) References Cited

U.S. PATENT DOCUMENTS

| | | | |
|---|---|---|---|
| 4,608,538 A | 8/1986 | Anderson | 329/103 |
| 6,608,527 B2 | 8/2003 | Moloudi et al. | 330/301 |
| 6,771,475 B2 | 8/2004 | Leete | 361/56 |
| 6,774,721 B1 * | 8/2004 | Popescu et al. | 330/253 |
| 7,113,744 B1 * | 9/2006 | Moloudi et al. | 330/253 |
| 7,116,953 B2 * | 10/2006 | Kim et al. | 455/147 |
| 7,203,472 B2 * | 4/2007 | Seppinen et al. | 455/226.1 |
| 2003/0181180 A1 | 9/2003 | Darabi et al. | 455/234.1 |
| 2003/0231446 A1 | 12/2003 | Leete | 361/56 |

OTHER PUBLICATIONS

L.C. Leung, "A 900-MHZ CMOS Bandpass Amplifier for Wireless Receivers," Aug. 1999.
E. L.C. Ng, "Microwave Transceiver Circuit Building Blocks," www.ocf.berkeley.edu/~eng/MS_thesis.pdf, 2003.
C.Y Wu et al., "The Design of a 3-V 900-MHz CMOS Bandpass Amplifier," IEEE Journal of Solid-State Circuits, vol. 32, No. 2, Feb. 1997.

* cited by examiner

*Primary Examiner*—Khanh V Nguyen
(74) *Attorney, Agent, or Firm*—Garlick Harrison & Markison (57) ABSTRACT

A gain boost circuit and methodology are described for providing improved gain boosting with tuned amplifier circuits, such as differential low noise amplifier circuits having output resonant tank circuits. By selectively controlling the current source for a negative transconductance stage coupled between the differential amplifier output and the output resonant tank circuits, the amplifier gain may be adjusted to compensate for temperature variations. In addition, the amplifier gain boost may be selectively added, removed or even incrementally adjusted by using a current source control circuit in the negative transconductance stage to adjust the negative transconductance value generated by the negative transconductance stage.

20 Claims, 7 Drawing Sheets

GAIN BOOSTING FOR TUNED DIFFERENTIAL LC CIRCUITS

This is a continuation of U.S. patent application Ser. No. 11/029,603, entitled "Gain Boosting for Tuned Differential LC Circuits," filed Jan. 5, 2005 now U.S. Pat. No. 7,202,740.

BACKGROUND OF THE INVENTION

1. Field of the Invention

The present invention is directed in general to communication systems. In one aspect, the present invention relates to a method and system for improving the gain boost of a low noise amplifier.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna. As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As the demand for enhanced performance (e.g., reduced interference and/or noise, improved quality of service, compliance with multiple standards, increased broadband applications, et cetera), smaller sizes, lower power consumption, and reduced costs increases, wireless communication device engineers are faced with a very difficult design challenge to develop such a wireless communication device. Typically, an engineer is forced to compromise one or more of these demands to adequately meet the others. Costs of manufacturing a radio frequency integrated circuit (IC) may be reduced by switching from one integrated circuit manufacturing process to another. For example, a CMOS process may be used instead of a bi-CMOS process since it is a more cost effective method of IC manufacture. Even though CMOS technology has provided a lot of attractions, there are still many technical hurdles needed to be overcome before monolithic integration of a transceiver is possible. For example, the CMOS process increases component mismatches, increases temperature related variations, and increases process variations.

One challenge that is encountered in the design and manufacture of RF signal integrated circuits relates to the design of a low noise amplifier (LNA) that provides adequate signal amplification without degrading the signal to noise ratio (SNR) significantly. LNAs are conventionally implemented either off-chip or with incompatible hybrid technologies, though in recent years, LNAs have been constructed in CMOS technology with some reasonable performance. When such amplifiers use output resonant tank circuits to increase the gain of the amplifier at the desired operating frequency, resistive losses resulting from non-idealities in such output tank circuits can limit or degrade the amount of gain generated by the amplifier by imposing an upper limit on the input impedance of the tank circuit.

Accordingly, an improved integrated circuit amplifier design is needed to provide low noise amplification. Further limitations and disadvantages of conventional systems will become apparent to one of skill in the art after reviewing the remainder of the present application with reference to the drawings and detailed description which follow.

SUMMARY OF THE INVENTION

In one aspect of the present invention, a method and system are disclosed for improving the gain provided by an amplifier by selectively controlling the current source for a negative transconductance stage coupled to an output resonant tank circuit in the amplifier. In a selected embodiment, the gain for an amplifier for amplifying received wireless communication signals is selectively boosted by using a negative transconductance circuit stage to introduce an adjustable negative transconductance or resistance value to compensate for losses generated by an output tank circuit portion of the amplifier that is tuned to provide a first impedance level at a desired operating frequency of the amplification circuitry. The adjustable negative transconductance circuit stage may be constructed with a current source transistor, a current source control circuit and a pair of cross-coupled transistors coupled between the current source transistor and the output tank circuit portion, where the current source control circuit controls the current through the current source transistor to adjust the adjustable negative transconductance value. For example, the amplifier gain boost may be selectively adjusted in response to temperature changes using a current source control circuit that includes a temperature-controlled current source (such as a PTAT current source) coupled through a diode-connected transistor to the current source transistor. Alternatively, the amplifier gain boost may be added or removed using a current source control circuit that includes a power down circuit (such as a switch control transistor) coupled through a diode-connected transistor to the current source transistor. In addition, by using a current source control circuit that includes a digitally controlled current source coupled through a diode-connected transistor to the current source transistor, the negative transconductance value generated by the negative transconductance stage may be adjusted to incrementally adjust the amplifier gain boost.

In accordance with various embodiments of the present invention, a method and apparatus provide for gain level boosting in a low noise amplifier (such as a differential low noise amplifier circuit at the front end of a receiver circuit formed on an integrated circuit) by selectively coupling an adjustable negative transconductance circuit between an amplifier circuit and an output tank circuit to effectively generate an adjustable negative transconductance value to compensate for any losses generated by the output tank circuit. For example, when the adjustable negative transconductance circuit is implemented with a pair of cross-coupled NMOS transistors, the adjustable negative transconductance value may be added or removed from the low noise amplifier by turning the negative transconductance circuit off in response to a power down signal and turning the negative transconductance circuit on in response to a power up signal. In addition or in the alternative, the adjustable negative transconductance value may be adjusted by increasing the amount of current supplied to the adjustable negative transconductance circuit in response to temperature changes, and/or by using a digitally controlled current source to provide different current levels to the adjustable negative transconductance circuit.

The objects, advantages and other novel features of the present invention will be apparent to those skilled in the art from the following detailed description when read in conjunction with the appended claims and accompanying drawings.

DETAILED DESCRIPTION

A method and apparatus are described for boosting the gain of an amplifier circuit by selectively controlling a negative resistance stage connected to a low noise amplifier output tank. While various details are set forth in the following description, it will be appreciated that the present invention may be practiced without these specific details. For example, selected aspects are shown in block diagram form, rather than in detail, in order to avoid obscuring the present invention. Some portions of the detailed descriptions provided herein are presented in terms of schematic descriptions and circuit depictions which are used by those skilled in the field of communication systems to describe and convey the substance of their work to others skilled in the art.

Figure 1:
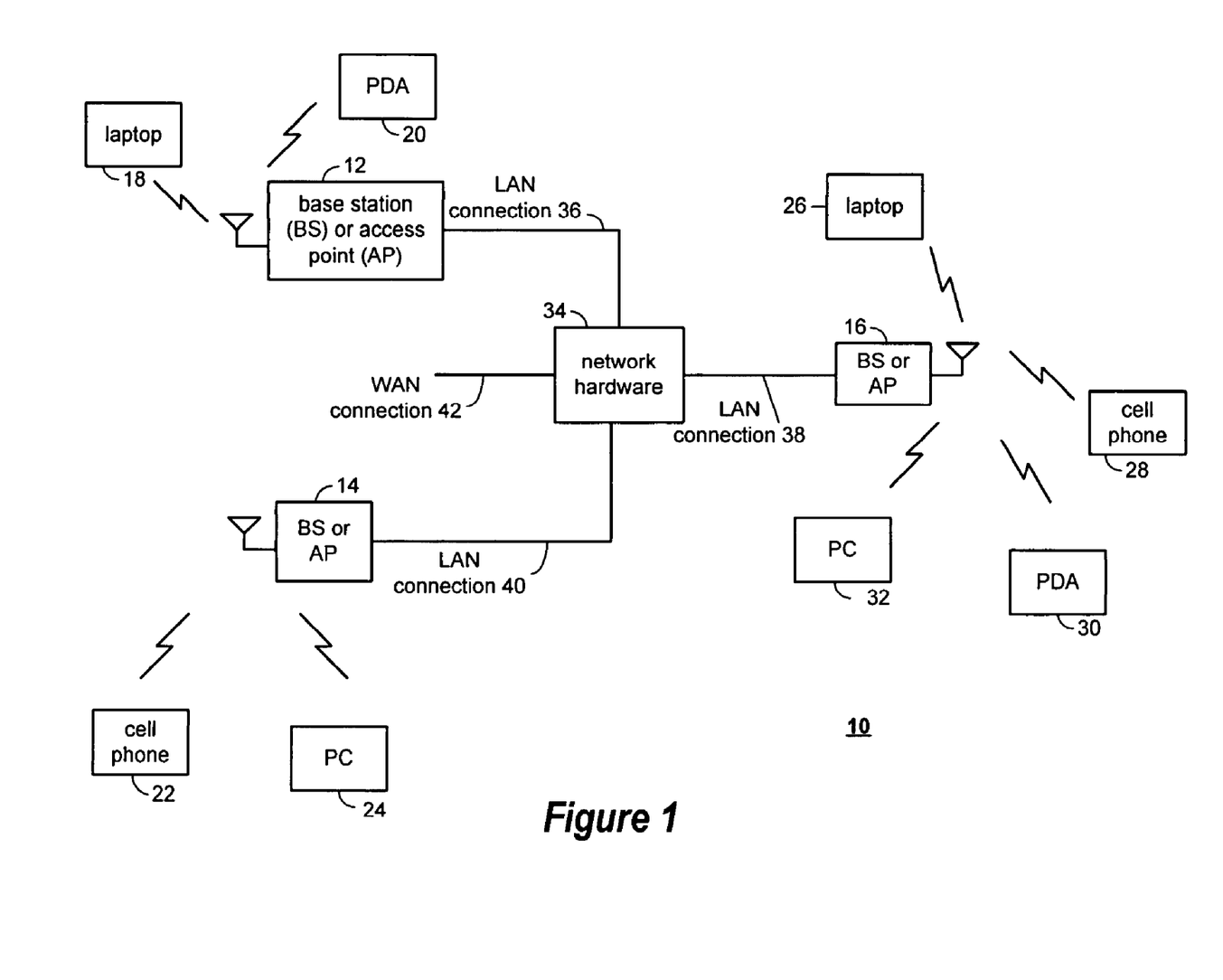
FIG. 1 is a schematic block diagram of a wireless communication system in accordance with an illustrative embodiment of the present invention.

FIG. 1 illustrates a wireless communication system 10 in which embodiments of the present invention may operate. As illustrated, the wireless communication system 10 includes a plurality of base stations and/or access points 12, 14, 16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34 (which may be a router, switch, bridge, modem, system controller, etc.) provides a wide area network connection 42 for the communication system 10. Each of the base stations or access points 12, 14, 16 has an associated antenna or antenna array to communicate with the wireless communication devices in its area. Typically, the wireless communication devices register with a particular base station or access point 12, 14, 16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
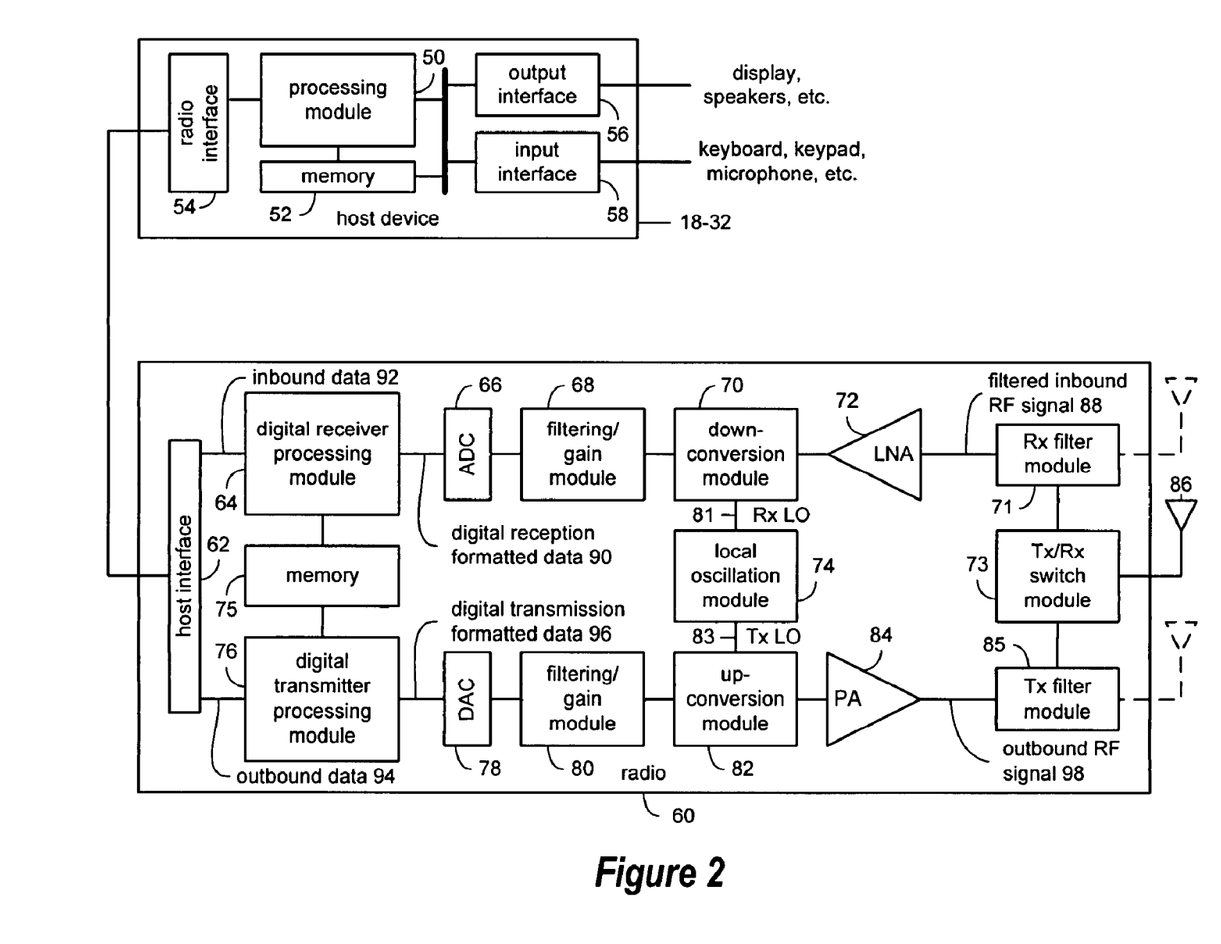
FIG. 2 is a schematic block diagram of a wireless communication device in accordance with an illustrative embodiment of the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal via the antenna 86, which was transmitted by a base station, an access point, or another wireless communication device. The antenna 86 provides the inbound RF signal to the receiver filter module 71 via the Tx/Rx switch 73, where the Rx filter 71 bandpass filters the inbound RF signal. The Rx filter 71 provides the filtered RF signal 88 to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of ordinary skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
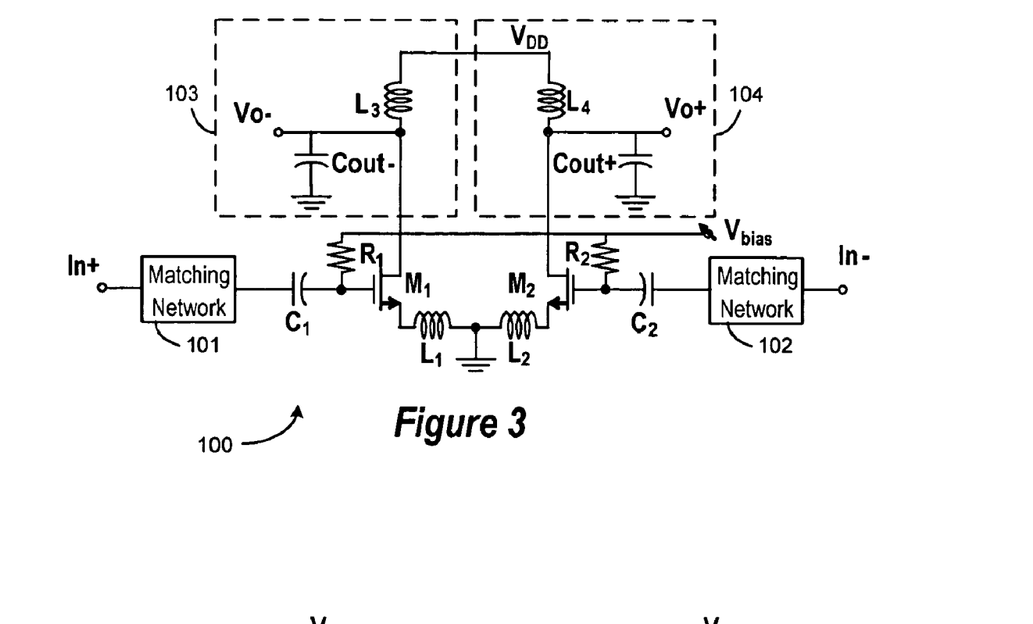
FIG. 3 is a simplified schematic of a power amplifier that is provided for illustration purposes.

While the present invention may be implemented in connection with a variety of signal amplifier circuits, a selected implementation is a low noise amplifier circuit. In a wireless receiver, the low-noise amplifier (LNA) is typically the first component in the signal receive path. The primary function of the LNA is to amplify signals received from the antenna without contributing undue noise to the received signal so that the signal-to-noise ratio will not be severely degraded by the circuit. The LNA input should also match the stage preceding the LNA (which is either an antenna or a RF bandpass filter) to ensure maximum power transfer by using any of a variety of available input matching circuits. The basic architecture of an exemplary LNA is illustrated in FIG. 3, which shows a differential LNA circuit 100 with input matching stages 101, 102. Because the preceding stage of a LNA is either an antenna or a RF bandpass filter, the input matching stages 101, 102 are used to match the LNA circuit inputs to the preceding stage (e.g., a 50-Ω antenna) so that maximum power transfer can be achieved. At the output of the LNA 100 are output resonant circuits (tanks) 103, 104 which are tuned to give the greatest impedance (and greatest gain) for the LNA 100 at the desired operating frequency. Each tank 103, 104 is depicted as an LC circuit, where the capacitors Cout− and Cout+ represent all capacitance (interconnect, device, designed, etc.) at the outputs Vo− and Vo+.

Figure 4A:
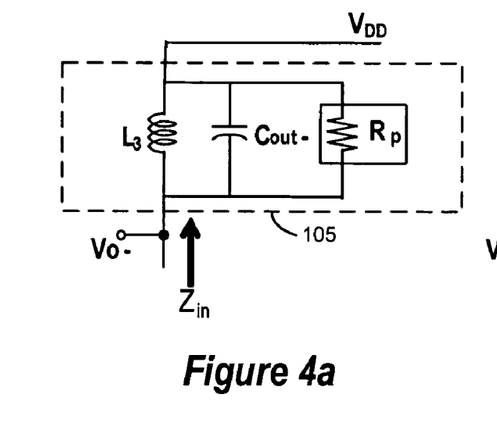
FIG. 4a is a simplified schematic of an idealized output tank circuit.

An idealized depiction of the output tank circuits 103, 104 would include an inductor L and capacitor C coupled in parallel between the reference voltage VDD and the output Vo, and would have an input impedance $(Zin)=j\omega L/(1-\omega^2 LC)$. At the frequency where L and C are perfectly resonant ($\omega_0=1/\sqrt{(LC)}$), the bottom term of Zin becomes zero, and the input impedance (Zin) becomes infinite, resulting in an unlimited gain for the LNA. However, in reality, resistive losses degrade the impedance provided by an output tank circuit. A lossy LC resonant tank 105 is illustrated in FIG. 4a as a parallel RLC circuit, where the parallel or parasitic resistance (Rp) represents losses in the inductor, lossy capacitance to the substrate and NMOS drain-source resistance, among other things. This results in a representation of the input impedance equal to $j\omega L/(1-\omega^2 LC+j\omega L/Rp)$, which is based on a simplified parallel tank model and is good at one frequency. Of course, it will be appreciated by persons of ordinary skill in the art that some of the losses are physically present in series with circuit elements connected to the tank, rather than in parallel, and/or are caused by lossy capacitance to ground and/or by magnetic losses in the substrate. Thus, a wide-band inductor model typically contains multiple elements in series, shunt and/or in parallel (such as elements for interwinding capacitance, metal capacitance to lossy substrate, series metal resistive losses, etc.), but can be represented with a simple parallel or series narrow-band model to approximate the impedance of the wide-band model at one frequency for use with a narrow range of frequencies. For this reason, the parallel tuned tank resistance does not truly represent the actual non-ideal tank circuit, but the actual tank circuit can be modeled by the parallel tank circuit at any one particular frequency. Thus, the parallel coupling of the physical resistance Rp will change for this model at different frequency solutions so that this model is good at one frequency.

At the center frequency ($\omega_0=1/\sqrt{(LC)}$) where it is useful to model the actual tank circuit, the input impedance Zin for the circuit of FIG. 4a is limited by the parallel representation of the losses in the tank, so that Zin=Rp. In other words, the parasitic resistance Rp of the output tuned circuit limits the gain of the LNA circuit. As the series losses in the tank elements become smaller and any parallel resistive components become larger, the value Rp calculated for the parallel model becomes larger, yielding a higher tank impedance. However, the parallel resistance Rp still represents the limit of the input impedance Zin of the tank.

Figure 4B:
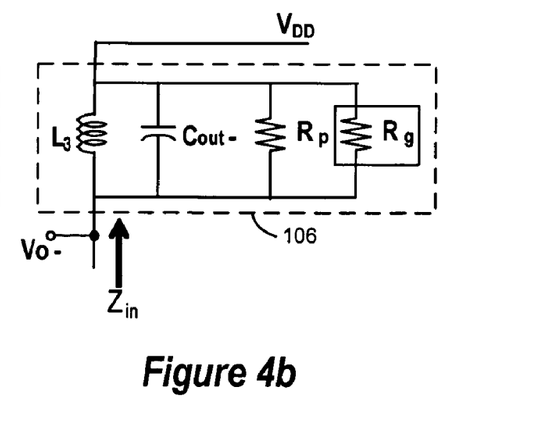
FIG. 4b is a simplified schematic of an non-idealized output tank circuit

To compensate for the losses (which may be represented as an approximation by Rp) in the non-ideal output tank circuit through which circuit energy is lost, a negative effective resistance Rg may be introduced in parallel to the resonant tank, as depicted in FIG. 4b, where Rg is an idealized representation of the actual circuit that will create it. Thus, Rg is added to compensate for the energy loss represented by Rp. Of course, it will be appreciated that the selection of a negative effective resistance Rg to offset the losses represented by Rp is an iterative process, since the introduction of the negative effective resistance Rg will change the frequency of the peak impedance for the real tank circuit, thereby altering the calculated representation of the losses Rp. With this tank circuit 106, the input impedance $Zin=j\omega L/(1-\omega^2 LC+(j\omega L(Rp+Rg)/RpRg))$. At the center frequency ($\omega_0=1/\sqrt{(LC)}$), the input resistance Zin becomes RpRg/(Rp+Rg). By generating a negative effective parallel resistance Rg, the input impedance Zin of the tank circuit 106 (and resulting amplifier gain) may be increased. Indeed, if Rg=−Rp, the input impedance would be infinite, making the LNA gain unlimited. However, such a configuration would be marginally unstable. In particular, if Rg is negative and has an absolute value that is smaller than the parallel physical resistance (|Rg|<Rp), the value of the input impedance Zin is negative, which makes the LNA behave as an oscillator. However, by selecting a negative value for the Rg that has an absolute value that is larger than the parallel physical resistance (|Rg|>Rp), the value of the input impedance Zin is positive, so that the correct choice of Rg can boost the LNA gain.

A negative Rg value for the output tank can be generated in any desired way. For example, in a selected embodiment depicted in FIG. 5, a negative resistance stage 110 may be added to the output of the low noise amplifier 115 to generate a negative impedance (Zin-stage). The negative resistance stage 110 includes a cross-coupled transistor pair M3, M4 with each transistor coupled between a grounded resistor (R) and an output node (Vo−, Vo+). Thus, each differential signal, Vo− and Vo+, is coupled to the drain of one transistor and a gate of the other transistor in the cross-coupled transistor pair. If Vo− and Vo+ signals are equal and opposite, the input impedance (Zin-stage) for the negative resistance stage 110 is Zin-stage=$-((1+g_m R)/g_m)$, where $g_m$ is the transconductance for the transistors M3, M4. If the transconductance $g_m$ and resistance R values for the negative resistance stage 110 are designed so that $g_m R$ is >>1, then the input impedance to the negative stage Zin-stage=−R. By adding a negative resistance stage 110 to the output of the low noise amplifier 115 where $g_m R$>>1 and value of R is greater than Rp, the LNA circuit does not oscillate.

Figure 5:
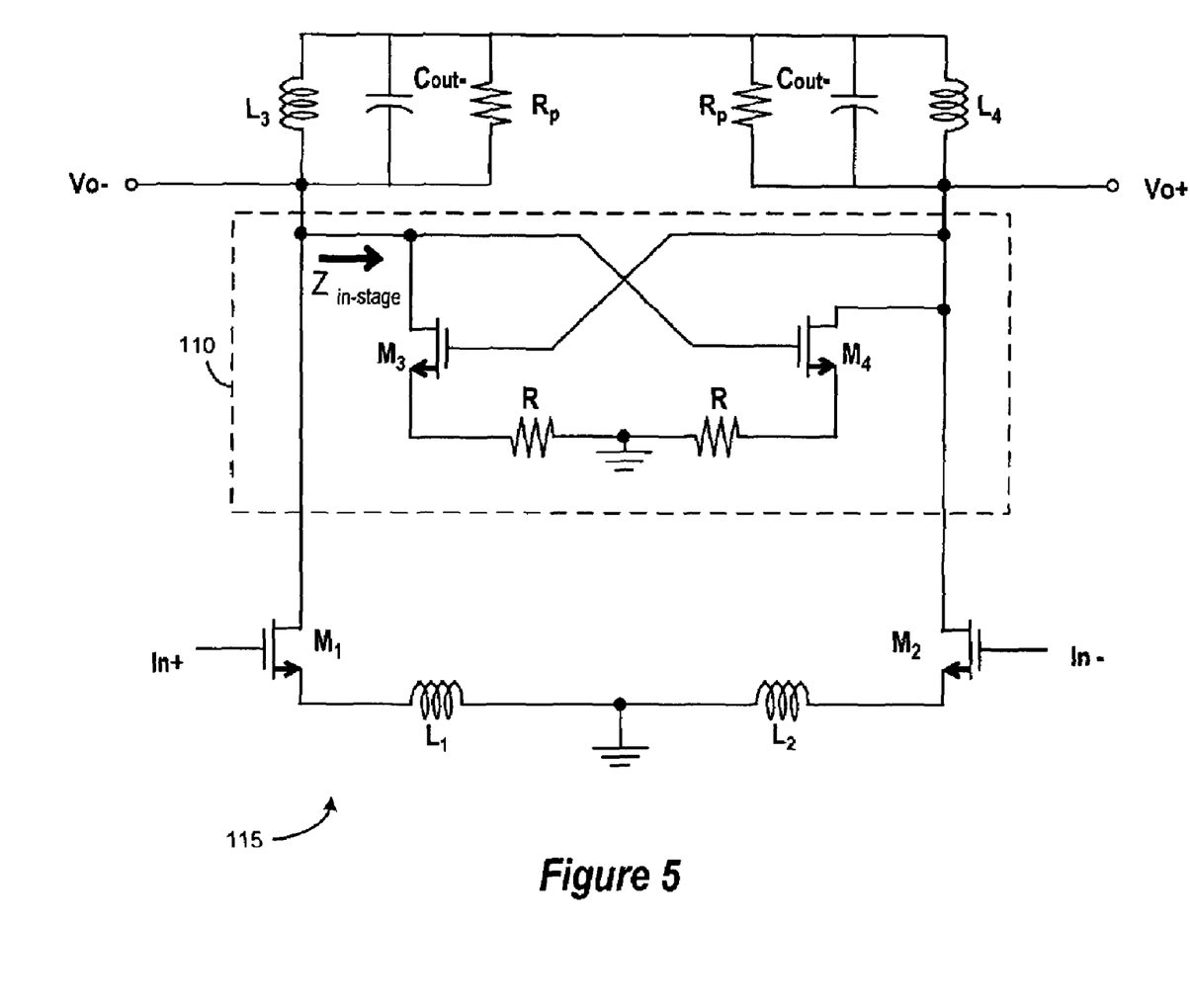
FIG. 5 is a simplified schematic of an exemplary power amplification system that includes a negative resistance stage.

While the negative resistance stage 110 may be implemented with grounded resistors (R), each grounded resistor may instead be replaced with the drain-source conductance of a field effect transistor (not shown) that is biased in its linear region by a bias or control voltage applied to the gates of the field effect transistors. In this implementation, the input impedance for the negative resistance stage is Zin-stage=$-((1+g_m g_{ds})/g_m)$, where $g_m$ is the transconductance for the transistors M3, M4 and $g_{ds}$ is the transconductance for the replacement field effect transistors that may be adjusted by the bias or control voltage.

Figure 6:
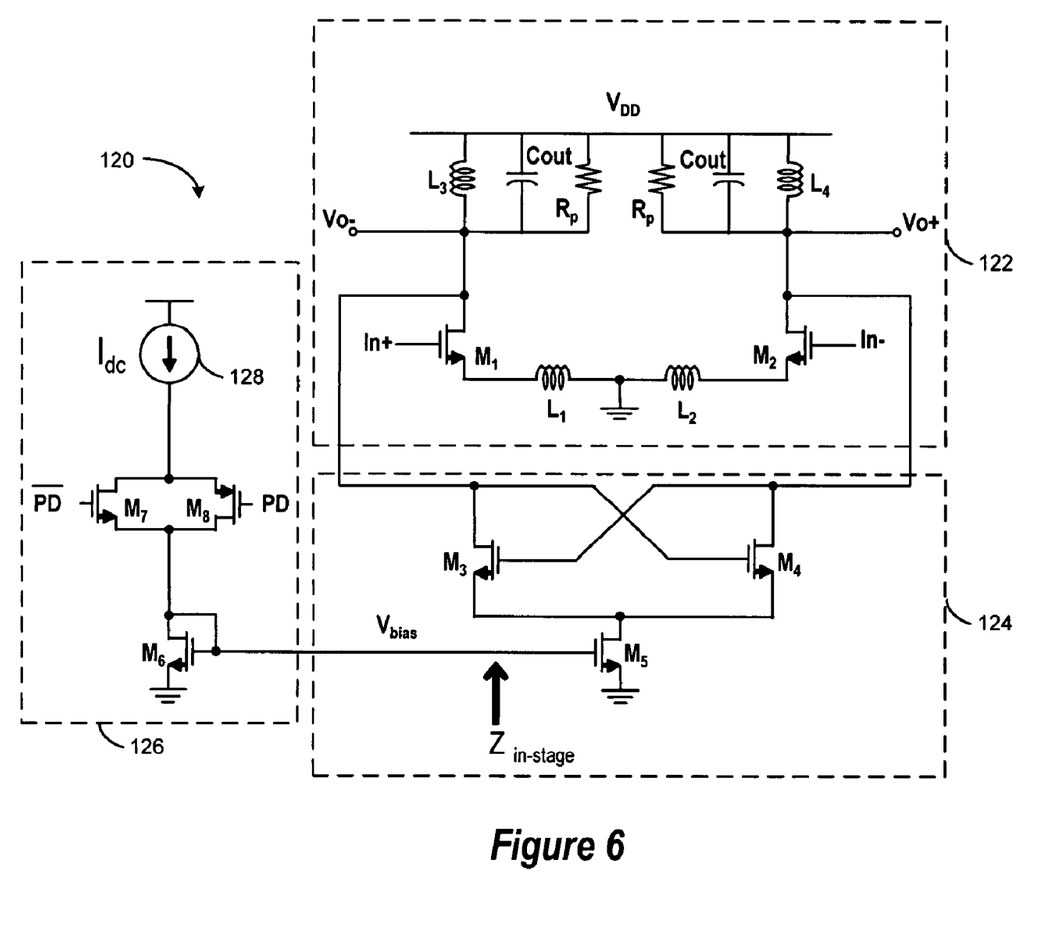
FIG. 6 is a simplified schematic of an exemplary power amplification system that includes an adjustable negative transconductance stage.

Another implementation of a low noise amplifier configuration 120 uses a negative transconductance stage 124 with a current source transistor M5 in place of the grounded resistors R, as shown in FIG. 6. With this implementation, the negative impedance (Zin-stage) is no longer a function of a resistor R, but is instead only a function of only the transconductance $g_m$ of the cross-coupled pair. By designing the negative stage 124 so that the transconductance $g_m<1/R_p$, the overall amplifier gain may be boosted while maintaining the stability of the LNA circuit 122.

In some applications, it may be desirable to connect the negative transconductance circuit to the LNA circuit 122 so that gain boost is always obtained. However, in accordance with the present invention and as depicted in FIG. 6, a power down circuit 126 may optionally be included to control the connection of the negative transconductance stage 124 to the LNA 122. In the depicted example, the power down circuit 126 includes a pair of switch control transistors M7, M8 coupled in parallel between a current source 128 (that provides a current Idc) arid a diode-connected transistor M6 that is a current source for the negative transconductance stage 124. By applying power up and power down signals (PD, PD complement) to the switch control transistors M7, M8, the bias current Idc may be passed (PD=Low) or blocked (PD=High), turning the negative transconductance stage 124 on or off. In particular, when the power up signals allow Idc to pass, transistors M6 and M5 act as a bias mirror to provide a replica of Idc to the cross-coupled transistor pair M3 and M4 in the negative transconductance stage 124, creating the negative transconductance. With this configuration, the LNA circuit 122 may operate with the negative transconductance stage turned off (in which case there is no gain boost) or with it turned on (in which case there is gain boost). By using a power down circuit to control the connection of the negative transconductance stage to the LNA, flexibility in testing and operation is provided.

Figure 7:
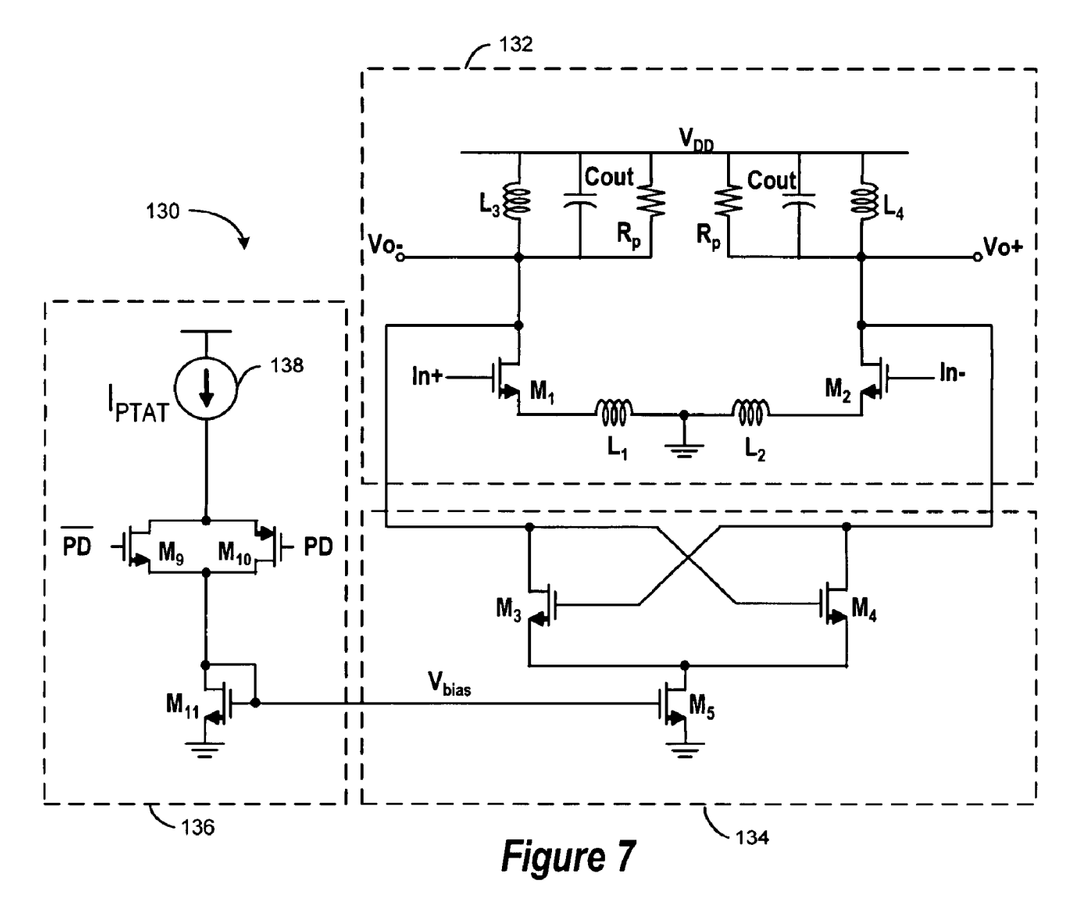
FIG. 7 is a simplified schematic of another exemplary power amplification system that includes a PTAT controlled negative transconductance stage.

In accordance with another exemplary configuration 130 of the present invention depicted in FIG. 7, the negative transconductance value provided by the negative stage 134 can be adjusted easily by controlling the current through the current source M5, thereby allowing the gain of the LNA circuit 132 to be adjusted by controlling the current through current source M5. In particular, since the transconductance of a MOS device is proportional to its bias current (to a first order approximation), the amount of negative transconductance provided by the negative transconductance stage 134 may be adjusted by adjusting the bias current for the current source M5 to the negative transconductance stage 134. As more gain from the LNA circuit 132 is needed, the current source is adjusted to decrease the transconductance $g_m$, thereby increasing the input impedance Zin.

One potential application is to adjust the negative transconductance stage to account for an increase in circuit temperature which increases the resistive losses in the inductors, thereby decreasing the parasitic resistance Rp in parallel tank circuit model described above. An exemplary solution is to use a temperature control circuit 136 to control the gain performance of the LNA circuit 132, where the temperature control circuit 136 includes a pair of switch control transistors M9, M10 coupled in parallel between a proportional-to-absolute temperature (PTAT) current source 138 (that provides current that is proportional to absolute temperature) and a diode-connected transistor M11 that is a current source for the negative transconductance stage 134. The PTAT current source 138 is used to control the negative transconductance stage so that current is provided at the negative transconductance stage to compensate for the de-queueing of the inductor in the tank circuit that is caused by a rise in temperature. Thus, the PTAT driven negative transconductance stage 134 compensates for inductor degradation that occurs with increased temperature, thereby helping to stabilize the LNA circuit gain over temperature.

Figure 8:
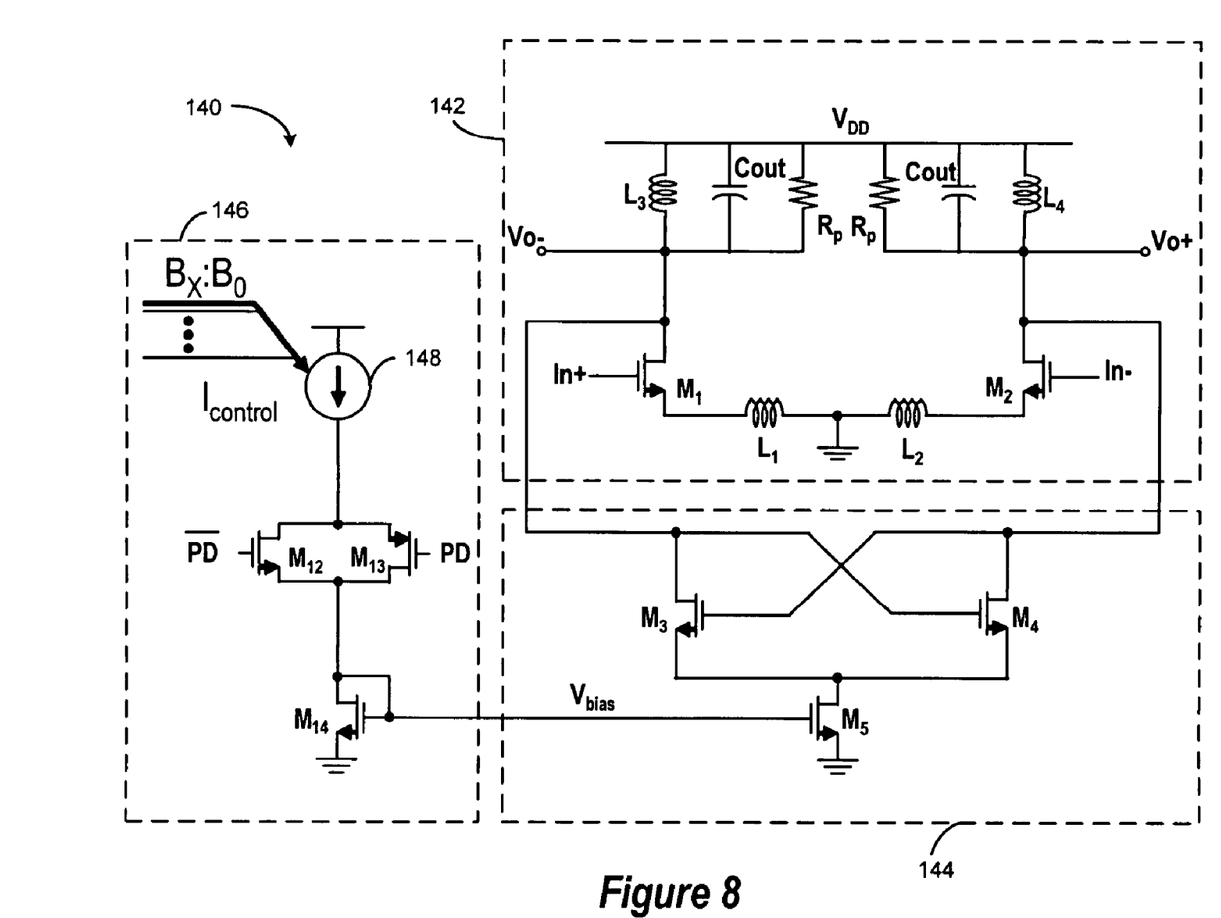
FIG. 8 is a simplified schematic of another exemplary power amplification system that includes a digitally controlled negative transconductance stage.

Another exemplary configuration depicted in FIG. 8 provides for an adjustable negative transconductance stage under control of a switchable current source so that multiple discrete gain steps may be generated by the LNA circuit 142. In the depicted example, a programmable control circuit 146 is used to control the gain performance of the LNA circuit 142, where the programmable control circuit 146 includes a pair of switch control transistors M12, M13 coupled in parallel between a digitally controlled current source 148 (that provides different current levels) and a diode-connected transistor M14 that is a current source for the negative transconductance stage 144. As will be appreciated, there are many types of programmable control circuits that could be used to yield different types of values from the negative transconductance stage 144, such as by using a current source 148 that is digitally controlled by one or more control words (Bx ... B0) having any number of control bits. Thus, by using a digitally controlled current source 148 to control the amount of negative transconductance generated by the stage 144 to offset the inductor losses in the tank circuit, the gain of the LNA 142 may be adjustably controlled. In addition, the programmable control circuit may include power down circuitry M12, M13 to disconnect the negative transconductance stage 144 from the LNA circuit 142.

In a single chip integrated circuit embodiment of the present invention, a gain-boosted amplifier is disclosed for use in a radio transceiver, where the amplifier includes an adjustable negative resistance/transconductance stage that may be used to compensate for parasitic resistance losses in the output tank circuit and/or for temperature-induced inductance degradation. In addition, by using a digitally controlled current source to control the current source for a negative resistance/transconductance stage, a plurality of discrete amplifier gain levels may be provided in an integrated single chip radio transceiver circuit fabricated with CMOS technology. In the integrated circuit implementation(s), the present invention reduces board level components, thereby reducing costs and improving performance over prior art approaches. Thus, the present invention shows, for the first time, a fully integrated digital receiver with an amplifier having the disclosed methodology for providing an adjustable gain boost function.

The particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A gain boost amplifier circuit, comprising:
   a signal amplifier circuit for amplifying an input signal by a gain value to generate an amplified signal at an output;
   an output resonant circuit coupled to the output that is tuned to provide a first impedance level for the signal amplifier circuit; and
   an adjustable negative transconductance stage coupled between the output resonant circuit and the signal amplifier circuit for generating an adjustable negative transconductance value, thereby boosting the gain value of the signal amplifier circuit.

2. The gain boost amplifier circuit of claim 1, wherein the adjustable negative transconductance stage comprises:
   a current source transistor;
   a current source control circuit coupled to the current source transistor; and
   a pair of cross-coupled transistors coupled between the current source transistor and the output of the signal amplifier circuit, where the current source control circuit controls the current through the current source transistor to adjust the adjustable negative transconductance value.

3. The gain boost amplifier circuit of claim 2, where the current source control circuit comprises a current source coupled through a power down circuit and diode-connected transistor to the current source transistor, whereby the power down circuit is used to control the adjustable negative transconductance stage.

4. The gain boost amplifier circuit of claim 3, where the power down circuit comprises at least one switch control transistor coupled between the current source and the diode-connected transistor.

5. The gain boost amplifier circuit of claim 2, where the current source control circuit comprises a PTAT current source for controlling the current through the current source transistor to reduce the adjustable negative transconductance value as the temperature increases.

6. The gain boost amplifier circuit of claim 5, where the current source control circuit comprises a power down circuit coupled to the PTAT current source.

7. The gain boost amplifier circuit of claim 2, where the current source control circuit comprises a digitally controlled current source coupled through a diode-connected transistor to the current source transistor, whereby the digitally controlled current source controls the current through the current source transistor to provide different current levels for the adjustable negative transconductance stage.

8. The gain boost amplifier circuit of claim 7, where the current source control circuit comprises a power down circuit coupled between the digitally controlled current source and the diode-connected transistor.

9. The gain boost amplifier circuit of claim 8, wherein the power down circuit comprises a pair of switch control transistors coupled between the digitally controlled current source and the diode-connected transistor.

10. The gain boost amplifier circuit of claim 1 implemented as a low noise amplifier in a receiver.

11. A method for boosting a gain level for a signal amplifier, comprising selectively coupling an adjustable negative transconductance circuit between an amplifier circuit and an output tank circuit to selectively generate an adjustable negative transconductance value to compensate for any losses generated by the output tank circuit.

12. The method of claim 11, where the adjustable negative transconductance circuit comprises:
   a current source transistor;
   a current source control circuit coupled to the current source transistor; and
   a pair of cross-coupled transistors coupled between the current source transistor and the signal amplifier, where the current source control circuit controls the current through the current source transistor to adjust the adjustable negative transconductance value.

13. The method of claim 11, where selectively coupling the adjustable negative transconductance circuit comprises turning the adjustable negative transconductance circuit off in response to a power down signal and turning the adjustable negative transconductance circuit on in response to a power up signal.

14. The method of claim 11, where selectively coupling the adjustable negative transconductance circuit comprises applying a PTAT current source to the adjustable negative transconductance circuit to increase the amount of current supplied to the adjustable negative transconductance circuit in response to temperature changes.

15. The method of claim 11, where the selectively coupling the adjustable negative transconductance circuit comprises applying a digitally controlled current source to the adjustable negative transconductance circuit to provide different current levels to the adjustable negative transconductance circuit.

16. A receiver comprising:
   an amplifier circuit coupled to receive and amplify a signal by a gain factor,
   an output tank circuit coupled to the amplifier circuit and tuned to increase the gain of the amplifier circuit, and
   an adjustable negative transconductance circuit selectively coupled to the output tank circuit.

17. The receiver of claim 16, further comprising a temperature controlled current source for controlling the amount of current provided to the negative transconductance circuit in response to temperature.

18. The receiver of claim 16, further comprising a switchable current source circuit for providing a plurality of different current levels to the negative transconductance circuit.

19. The receiver of claim 16, where the amplifier circuit comprises a differential low noise amplifier circuit in an integrated circuit receiver front end.

20. The receiver of claim 16, further comprising a connection circuit for selectively coupling the adjustable negative transconductance circuit to the output tank circuit in response to a power up signal.

* * * * *